US012566218B2

(12) United States Patent
Kuroda

(10) Patent No.: US 12,566,218 B2
(45) Date of Patent: Mar. 3, 2026

(54) BATTERY PACK MONITORING DEVICE

(71) Applicant: SUBARU CORPORATION, Tokyo (JP)

(72) Inventor: Kazunori Kuroda, Tokyo (JP)

(73) Assignee: SUBARU CORPORATION, Tokyo (JP)

( * ) Notice: Subject to any disclaimer, the term of this patent is extended or adjusted under 35 U.S.C. 154(b) by 444 days.

(21) Appl. No.: 18/078,450

(22) Filed: Dec. 9, 2022

(65) Prior Publication Data

US 2023/0194623 A1 Jun. 22, 2023

(30) Foreign Application Priority Data

Dec. 20, 2021 (JP) ................................. 2021-205674

(51) Int. Cl.
*G01R 31/396* (2019.01)
*B60K 1/04* (2019.01)
(Continued)

(52) U.S. Cl.
CPC .............. *G01R 31/396* (2019.01); *B60K 1/04* (2013.01); *H01M 10/425* (2013.01);
(Continued)

(58) Field of Classification Search
CPC ...... B60K 1/04; G01R 31/371; G01R 31/396; H01M 10/425; H01M 10/48; H01M 2010/4271; H01M 2010/4278; H02J 50/80
See application file for complete search history.

(56) References Cited

U.S. PATENT DOCUMENTS

2004/0196152 A1* 10/2004 Tice ........................ G08B 25/10
340/539.26
2007/0268025 A1* 11/2007 Wilke .................... G07C 5/008
324/639
(Continued)

FOREIGN PATENT DOCUMENTS

WO 2014/103008 A1 7/2014

OTHER PUBLICATIONS

Jung et al., Structural Failure Detection Using Wireless Transmission Rate From Piezoelectric Energy Harvesters, IEEE, 8.2021 (Year: 2021).*
(Continued)

*Primary Examiner* — Kyle R Quigley
(74) *Attorney, Agent, or Firm* — TROUTMAN PEPPER LOCKE LLP

(57) ABSTRACT
A battery pack monitoring device includes a battery pack, at least one first wireless communicator, at least one second wireless communicator, and a control device. The battery pack is installed in a vehicle and includes a battery. The at least one first wireless communicator is disposed inside the battery pack and can perform wireless communication. The at least one second wireless communicator is disposed in the vehicle outside the battery pack and can perform wireless communication. The control device includes one or more processors, and one or more memories. The one or more processors are configured to execute a process including trying the wireless communication between the first wireless communicator and the second wireless communicator, and estimating the presence and/or absence of a damage to the battery pack based on an establishment state of the wireless communication between the first wireless communicator and the second wireless communicator.

10 Claims, 10 Drawing Sheets

(51) Int. Cl.
    H01M 10/42         (2006.01)
    H02J 50/80         (2016.01)

(52) U.S. Cl.
    CPC ..... H02J 50/80 (2016.02); *H01M 2010/4271*
            (2013.01); *H01M 2010/4278* (2013.01)

(56)            References Cited

U.S. PATENT DOCUMENTS

| | | | |
|---|---|---|---|
| 2010/0075220 A1* | 3/2010 | Heo | H01M 50/116 |
| | | | 429/163 |
| 2012/0089299 A1* | 4/2012 | Breed | B60R 21/013 |
| | | | 701/1 |
| 2016/0056510 A1 | 2/2016 | Takeuchi et al. | |
| 2020/0021119 A1* | 1/2020 | Kim | H02J 7/0014 |

OTHER PUBLICATIONS

Goldman, Electric Vehicles, Batteries, Cobalt, and Rare Earth Metals, The Equation, 2017 (Year: 2017).*
Unknown Author, JRE Test, Apr. 22, 2019 (Year: 2019).*

\* cited by examiner

BATTERY PACK MONITORING DEVICE

CROSS-REFERENCE TO RELATED APPLICATION

The present application claims priority from Japanese Patent Application No. 2021-205674 filed on Dec. 20, 2021, the entire contents of which are hereby incorporated by reference.

BACKGROUND

The disclosure relates to a battery pack monitoring device for monitoring a battery pack.

Domestic Re-publication of PCT International Publication for Patent Application No. 2014/103008, for example, discloses a battery system including a battery pack in which a battery, a monitoring unit, and a management unit are disposed. In the disclosed battery system, the monitoring unit obtains battery information such as a battery voltage, and the obtained battery information is wirelessly transmitted to the management unit inside the battery pack.

SUMMARY

An aspect of the disclosure provides a battery pack monitoring device. The battery pack monitoring device includes a battery pack, at least one first wireless communicator, at least one second wireless communicator, and a control device. The battery pack is installed in a vehicle and includes a battery. The at least one first wireless communicator is disposed inside the battery pack and configured to perform wireless communication. The at least one second wireless communicator is disposed in the vehicle outside the battery pack and configured to perform wireless communication. The control device includes one or more processors, and one or more memories coupled to the one or more processors. The one or more processors are configured to execute a process including trying the wireless communication between the at least one first wireless communicator and the at least one second wireless communicator, and estimating presence and/or absence of a damage to the battery pack based on an establishment state of the wireless communication between the at least one first wireless communicator and the at least one second wireless communicator.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to describe the principles of the disclosure.

DETAILED DESCRIPTION

A battery pack is enclosed by a metal member to protect a battery in the battery pack from, for example, short-circuiting caused by an impact applied from the outside or water penetration. If the battery pack is damaged, the function of protecting the battery deteriorates.

It is desirable to provide a battery pack monitoring device capable of monitoring a battery pack.

Embodiments of the disclosure will be described below with reference to the accompanying drawings. Particular sizes, materials, numerical values, and so on indicated in the embodiments are merely examples for making the disclosure easier to understand and are not intended to limit the disclosure unless otherwise specified. The drawings are schematic and are not intended to be drawn to scale. In this specification and the drawings, components having substantially the same functions or configurations are denoted by the same reference signs, and duplicate description of those components is omitted. Moreover, components not directly related to the disclosure are omitted from the drawings.

Figure 1:
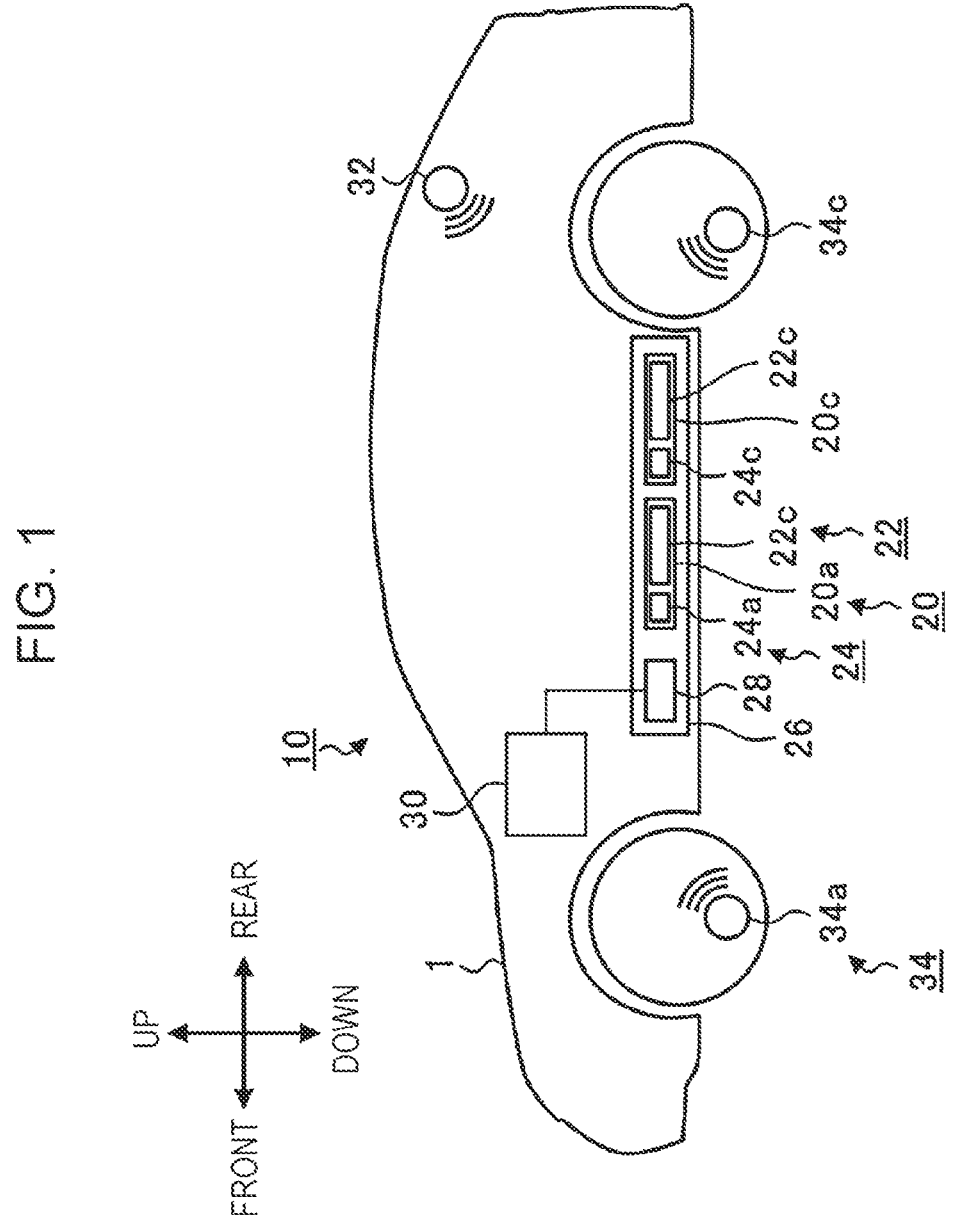
FIG. 1 is a schematic side view illustrating a configuration of a vehicle to which a battery pack monitoring device according to an embodiment is applied.
Figure 2:
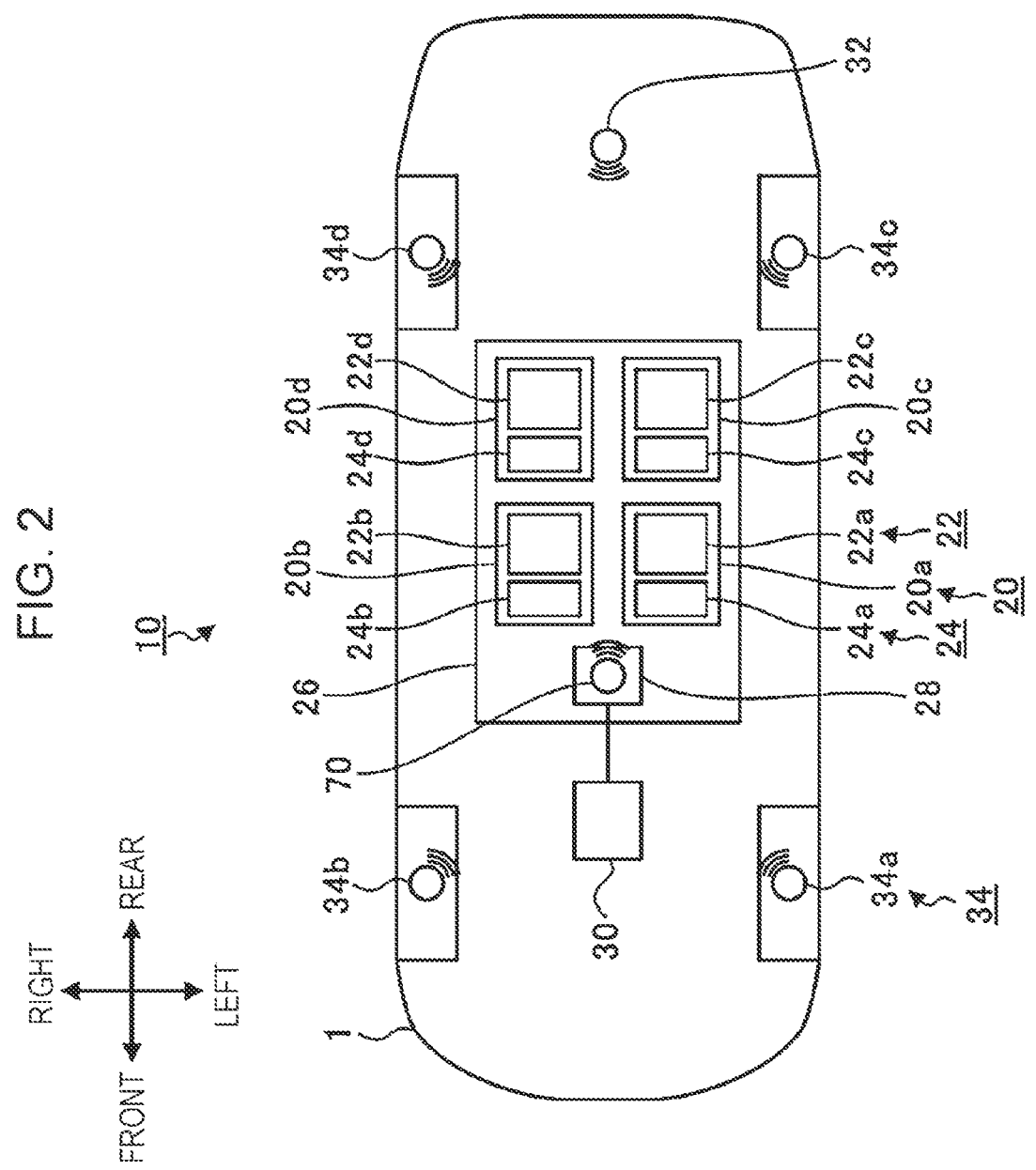
FIG. 2 is a schematic plan view illustrating the configuration of the vehicle to which the battery pack monitoring device according to the embodiment is applied.

FIG. 1 is a schematic side view illustrating a configuration of a vehicle 1 to which a battery pack monitoring device 10 according to a first embodiment is applied. FIG. 2 is a schematic plan view illustrating the configuration of the vehicle 1 to which the battery pack monitoring device 10 according to the first embodiment is applied. In FIG. 1, up and down directions and front and rear directions are denoted by arrows with respect to the vehicle 1. In FIG. 2, left and right directions and the front and rear directions are denoted by arrows with respect to the vehicle 1. In the following, components of the vehicle 1 related to the battery pack monitoring device 10 are described, and description of other components of the vehicle 1 is omitted.

As illustrated in FIG. 2, the vehicle 1 includes a battery module 20a, a battery module 20b, a battery module 20c, and a battery module 20d. Hereinafter, the battery module 20a, the battery module 20b, the battery module 20c, and the battery module 20d are collectively referred to as a "battery module 20" in some cases. In an example of FIG. 2, four battery modules 20 are installed in the vehicle 1. However, the number of the battery modules 20 installed in the vehicle 1 is not limited to four and may be one, two, three, or five or more.

The battery module 20a includes a battery 22a and a monitoring unit 24a. The battery module 20b includes a battery 22b and a monitoring unit 24b. The battery module 20c includes a battery 22c and a monitoring unit 24c. The battery module 20d includes a battery 22d and a monitoring unit 24d. Hereinafter, the battery 22a, the battery 22b, the battery 22c, and the battery 22d are collectively referred to as a "battery 22" in some cases. The monitoring unit 24a, the monitoring unit 24b, the monitoring unit 24c, and the monitoring unit 24d are also collectively referred to as a "monitoring unit 24" in some cases. As described above, each battery module 20 includes the battery 22 and the monitoring unit 24.

The battery 22 is a rechargeable secondary battery such as a lithium-ion battery, for example. The battery 22 is, for example, an assembled battery composed of multiple cells coupled in series. Although not illustrated, the vehicle 1 includes a motor as a drive source for running.

The battery 22 supplies electric power to the motor. The vehicle 1 is an electric automobile or a hybrid electric automobile with the battery 22.

The monitoring unit 24 monitors a state of the battery 22 belonging to the same battery module 20 to which the monitoring unit 24 belongs, namely a state of the battery 22 corresponding to the monitoring unit 24. For instance, the monitoring unit 24a measures a voltage of the battery 22a and a temperature of the battery 22a over time. The monitoring unit 24b measures a voltage of the battery 22b and a temperature of the battery 22b over time. The monitoring unit 24c measures a voltage of the battery 22c and a temperature of the battery 22c over time. The monitoring unit 24d measures a voltage of the battery 22d and a temperature of the battery 22d over time.

The vehicle 1 includes, in addition to the battery modules 20, a battery pack (case) 26, a management unit 28, and a vehicle control device 30. The battery pack 26 is formed as a hollow box made of a metal material and is enclosed. The battery modules 20 and the management unit 28 are disposed inside the battery pack 26. Thus, the batteries 22 are disposed inside the battery pack 26. The battery pack 26 protects the batteries 22 inside the battery pack 26 from, for example, the short-circuiting caused by an impact applied from the outside or water penetration.

The management unit 28 manages each of the battery modules 20. The management unit 28 and the monitoring units 24 each have the wireless communication function. For instance, the management unit 28 can establish wireless communication with each monitoring unit 24 inside the battery pack 26. The monitoring unit 24 transmits battery information including the measured voltage and temperature of the battery 22 to the management unit 28 via wireless communication. The management unit 28 receives, for each of the monitoring units 24, the battery information transmitted from the monitoring units 24 via the wireless communication. The management unit 28 may derive a state of charge (SOC) of the battery 22 of interest based on the voltage, which is obtained from the monitoring unit 24, of that battery 22.

The vehicle control device 30 controls the entirety of the vehicle 1, including, for example, running control of the vehicle 1. The vehicle control device 30 is disposed outside the battery pack 26. The management unit 28 is coupled to the vehicle control device 30 via a wired communication network such as a Controller Area Network (CAN). The management unit 28 transmits the battery information obtained from the monitoring unit 24 to the vehicle control device 30 via wired communication. The vehicle control device 30 may reflect the battery information obtained from the management unit 28 on the running control of the vehicle 1.

As illustrated in FIG. 1, the battery pack 26 is disposed, for example, at a center of a body lower portion of the vehicle 1. As illustrated in FIG. 2, the battery modules 20 are disposed in an inner space of the battery pack 26 at positions distributed in a horizontal direction with respect to the battery pack 26. For instance, the battery module 20a is disposed at a front left side in the battery pack 26. The battery module 20b is disposed at a front right side in the battery pack 26. The battery module 20c is disposed at a rear left side in the battery pack 26. The battery module 20d is disposed at a rear right side in the battery pack 26.

The vehicle 1 includes a rearview camera 32, a tire air pressure sensor 34a, a tire air pressure sensor 34b, a tire air pressure sensor 34c, and a tire air pressure sensor 34d. The vehicle control device 30 has the wireless communication function.

The rearview camera 32 is mounted within a vehicle compartment at a center of a roof rear portion and is positioned near a rear windshield. The rearview camera 32 can capture an image of the outside scenery in a rear direction of the vehicle 1 through the rear windshield. The rearview camera 32 has the wireless communication function. The rearview camera 32 transmits an image capturing result to the vehicle control device 30 via wireless communication. The vehicle control device 30 may display the image capturing result of the rearview camera 32 on, for example, a display of a navigation device (not illustrated).

The tire air pressure sensor 34a is mounted to a front left wheel. The tire air pressure sensor 34b is mounted to a front right wheel. The tire air pressure sensor 34c is mounted to a rear left wheel. The tire air pressure sensor 34d is mounted to a rear right wheel. Hereinafter, the tire air pressure sensor 34a, the tire air pressure sensor 34b, the tire air pressure sensor 34c, and the tire air pressure sensor 34d are collectively referred to as a "tire air pressure sensor 34" in some cases. In an example of FIG. 2, the tire air pressure sensors 34 are mounted to all the wheels of the vehicle 1. However, the embodiment of the disclosure is not limited to the example in which the tire air pressure sensors 34 are mounted to all the wheels of the vehicle 1, and the tire air pressure sensor 34 may be mounted to at least any one of the wheels.

The tire air pressure sensor 34 measures an air pressure of the tire to which the tire air pressure sensor 34 is mounted. The tire air pressure sensor 34 has the wireless communication function. The tire air pressure sensor 34 transmits the measured tire air pressure to the vehicle control device 30 via wireless communication. For instance, if the received tire air pressure is lower than a predetermined air pressure, the vehicle control device 30 may display, on an instrument panel, for example, an alarm indicating that the tire air pressure is low.

As described above, the battery pack 26 is enclosed by the metal member to protect the batteries 22 in the battery pack 26 from, for example, the short-circuiting caused by an impact applied from the outside or water penetration. If the battery pack 26 is damaged at its outer surface, for example, the function of protecting the batteries 22 deteriorates.

To cope with the above-described point, the battery pack monitoring device 10 is applied to the vehicle 1 according to the first embodiment. The battery pack monitoring device 10 includes a first wireless communicator disposed inside the battery pack 26 and being able to perform wireless communication, and a second wireless communicator disposed in the vehicle 1 outside the battery pack 26 and being able to perform wireless communication.

The first wireless communicator is, for example, the management unit 28 disposed inside the battery pack 26, more exactly a management communicator 70 (described later) in the management unit 28. The second wireless communicator is, for example, either one of the rearview camera 32 and the tire air pressure sensor 34 both disposed outside the battery pack 26.

The battery pack monitoring device 10 tries wireless communication between the first wireless communicator and the second wireless communicator. In FIG. 2, ripple marks as an example of pictographic symbols indicate that the wireless communication is tried between the management communicator 70 in the management unit 28 and the rearview camera 32, and that the wireless communication is tried between the management communicator 70 in the management unit 28 and each tire air pressure sensor 34.

As described above, the battery pack 26 is enclosed by the metal member in a normal state. Therefore, mutual communication between the management unit 28 as an example of the first wireless communicator and each of the rearview camera 32 and the tire air pressure sensors 34 as examples of the second wireless communicator are cut off by the battery pack 26. As a result, even when wireless communication is tried between the first wireless communicator and the second wireless communicator, the trial wireless communication cannot be established. In other words, a state in which no wireless communication is established between the first wireless communicator and the second wireless communicator is normal.

However, if any damage, such as a crack or a puncture, is caused in the battery pack 26, electric waves are allowed to propagate from the inside of the battery pack 26 to the outside or from the outside of the battery pack 26 to the inside through the damaged portion. Thus, in case of the battery pack 26 being damaged, when wireless communication is tried between the first wireless communicator and the second wireless communicator, the trial wireless communication is established.

Accordingly, the battery pack monitoring device 10 according to this embodiment can estimate the presence of a damage to the battery pack 26 based on an establishment state of the wireless communication between the first wireless communicator and the second wireless communicator.

Here, the wording "establishment state of the wireless communication" basically indicates whether the wireless communication is established, namely whether the wireless communication is successfully performed. In consideration of the event that the wireless communication is accidentally established, therefore, the establishment state of the wireless communication may be defined depending on whether the number of times that the wireless communication has been established for a predetermined period is a predetermined value or more. The predetermined value is here set to, for example, five, namely a suitable value with which the establishment of the wireless communication caused by the damage to the battery pack 26 and accidental establishment of the wireless communication can be discriminated from each other. The predetermined period may be set to one driving cycle, for example, or to any other suitable period.

For instance, if the wireless communication has been established the predetermined number of times for the predetermined period, the wireless communication may be regarded as being substantially established, and it may be estimated that the battery pack 26 is damaged. On the other hand, for instance, if the number of times that the wireless communication has been established for the predetermined period is less than the predetermined value, the wireless communication may be regarded as being substantially not established even if the wireless communication has been established once, and it may be estimated that the battery pack 26 is not damaged. Thus, the presence of the damage to the battery pack 26 may be estimated based on the substantial establishment of the wireless communication except for the accidental establishment of the wireless communication.

A close-range wireless communication standard such as Bluetooth, for example, can be used for the wireless communication between the first wireless communicator and the second wireless communicator. An electric wave in a frequency band of 2.4 GHz, for example, is used in the close-range wireless communication standard. Because of such an electric wave having a wavelength of about 10 cm, if any damage, such as a crack or a puncture, is caused in the battery pack 26, the electric wave is easy to propagate between the inside and the outside of the battery pack 26 through the damaged portion. Accordingly, whether the battery pack 26 is damaged can be appropriately estimated.

Figure 3:
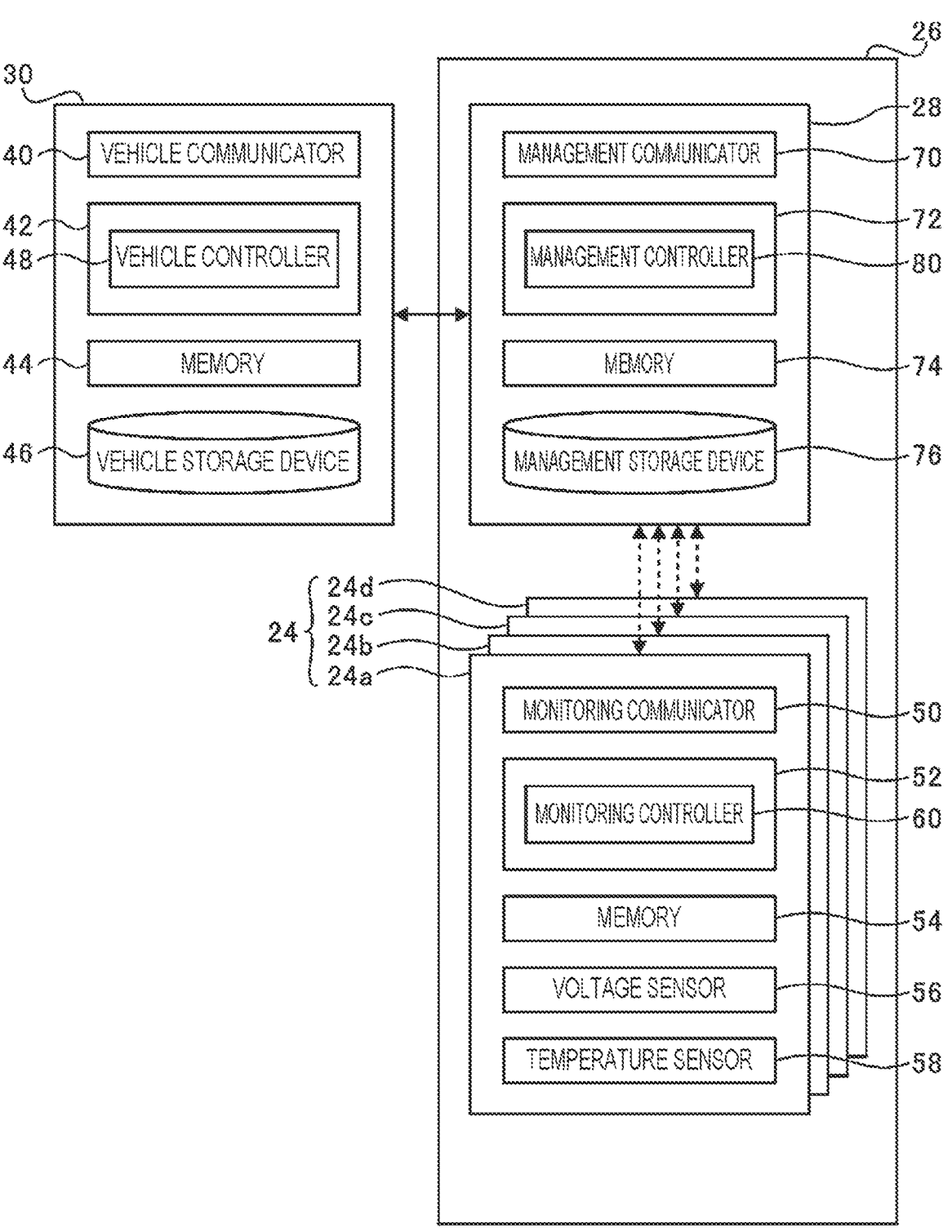
FIG. 3 is a block diagram illustrating configurations of a vehicle control device, a management unit, and a monitoring unit.

FIG. 3 is a block diagram illustrating configurations of the vehicle control device 30, the management unit 28, and the monitoring unit 24. In FIG. 3, solid-line arrows represent wired communication, and dotted-line arrows represent wireless communication.

The vehicle control device 30 includes a vehicle communicator 40, one or more processors 42, one or more memories 44 coupled to the one or more processors 42, and a vehicle storage device 46. The vehicle communicator 40 can perform wired communication with the management unit 28. The processors 42 each include a ROM in which programs and so on are stored, and a RAM serving as a working area. The processors 42 each cooperate with the programs stored in the memories to function as a vehicle controller 48 and to control the entirety of the vehicle 1.

The vehicle storage device 46 is constituted by a non-volatile storage element. The vehicle storage device 46 stores, for example, rearview camera identification information for identifying the rearview camera 32 and tire-air-pressure sensor identification information for identifying the tire air pressure sensor 34. The rearview camera identification information may be information with which the rearview camera 32 can be identified, and may be, for example, a MAC address of the rearview camera 32. The tire-air-pressure sensor identification information may be information with which the tire air pressure sensor can be identified, and may be, for example, a MAC address of each tire air pressure sensor 34. The vehicle controller 48 can establish the wireless communication with the rearview camera 32 based on the rearview camera identification information. The vehicle controller 48 can establish the wireless communication with each tire air pressure sensor 34 based on the identification information for that tire air pressure sensor.

The monitoring unit 24 includes a monitoring communicator 50, one or more processors 52, one or more memories 54 coupled to the one or more processors 52, a voltage sensor 56, and a temperature sensor 58. The monitoring communicator 50 can perform wireless communication with the management unit 28. The processors 52 each include a ROM in which programs and so on are stored, and a RAM serving as a working area. The processors 52 each cooperate with the programs stored in the memories 54 to function as a monitoring controller 60 and to execute a process of monitoring the battery module 20 corresponding to the monitoring controller 60.

The voltage sensor 56 measures a voltage of the battery 22 corresponding to the monitoring unit 24 to which the voltage sensor 56 belongs. The temperature sensor 58 measures a temperature of the battery 22 corresponding to the monitoring unit 24 to which the temperature sensor 58 belongs. The monitoring controller 60 transmits the battery information including the measured voltage and temperature of the battery 22 to the management unit 28 through the monitoring communicator 50 via wireless communication.

The management unit 28 includes the management communicator 70, one or more processors 72, one or more memories 74 coupled to the one or more processors 72, and a management storage device 76. The management communicator 70 can perform wired communication with the vehicle control device 30. The management communicator 70 can perform wireless communication with the monitoring unit 24. In addition, the management communicator 70 can try wireless communication with the rearview camera 32 and can further try wireless communication with the tire air pressure sensors 34.

The processors 72 each include a ROM in which programs and so on are stored, and a RAM serving as a working area. The processors 72 each cooperate with the programs stored in the memories 74 to function as a management controller 80. The management controller 80 executes processing related to management of each battery module 20. For instance, the management controller 80 obtains the battery information from each monitoring unit 24 through the management communicator 70. The management controller 80 transmits the obtained battery information to the vehicle control device 30 through the management communicator 70.

The management controller 80 tries wireless communication with the rearview camera 32 through the management communicator 70. The management controller 80 further tries wireless communication with each tire air pressure sensor 34 through the management communicator 70. Then, the management controller 80 estimates the presence of a damage and a position of the damage to the battery pack 26 based on the establishment state of the wireless communication with the rearview camera 32 and the establishment state of the wireless communication with each tire air pressure sensor 34.

The management storage device 76 is constituted by a nonvolatile storage element. The management storage device 76 stores monitoring-unit identification information for identifying each monitoring unit 24. The management controller 80 can establish the wireless communication with each monitoring unit 24 based on the monitoring-unit identification information. The management storage device 76 further stores the rearview camera identification information and the identification information for each of the tire air pressure sensors.

The management controller 80 tries the wireless communication with the rearview camera 32 based on the rearview camera identification information stored in the management storage device 76.

For instance, the management controller 80 transmits request information for requesting a response from the rearview camera 32 to the MAC address of the rearview camera 32. If the battery pack 26 is damaged, the request information transmitted from the management controller 80 is delivered to the rearview camera 32. The rearview camera 32 can receive the request information transmitted from the management controller 80 in parallel to execution of the inherent function of the rearview camera 32. When the destination of the received request information is destined for the MAC address of the rearview camera 32, the rearview camera 32 transmits response information, including the MAC address of itself, to the transmission source of the received request information.

When the management controller 80 receives the response information transmitted from the rearview camera 32, the management controller 80 establishes the wireless communication with the rearview camera 32. On the other hand, if the battery pack 26 is not damaged, the request information transmitted from the management controller 80 does not reach the rearview camera 32, and the response information is not transmitted from the rearview camera 32. Thus, when the management controller 80 cannot receive the response information from the rearview camera 32 even after the elapse of a predetermined time from the transmission of the request information from the management controller 80, the wireless communication between the management unit 28 and the rearview camera 32 is not established.

The management controller 80 tries the wireless communication with each tire air pressure sensor 34 based on the tire-air-pressure sensor identification information stored in the management storage device 76. A trial sequence of the wireless communication with the tire air pressure sensor 34 is almost the same as that of the wireless communication with the rearview camera 32.

For instance, the management controller 80 transmits request information for requesting a response from the tire air pressure sensor 34, with which the wireless communication is to be tried, to the MAC address of the relevant tire air pressure sensor 34. When the destination of the request information transmitted from the management controller 80 is destined for the MAC address of the relevant tire air pressure sensor 34, that tire air pressure sensor 34 transmits response information, including the MAC address of itself, to the transmission source of the received request information.

When the management controller 80 receives the response information transmitted from the tire air pressure sensor 34, the management controller 80 establishes the wireless communication with that tire air pressure sensor 34. On the other hand, when the management controller 80 cannot receive the response information from the tire air pressure sensor 34 even after the elapse of a predetermined time from the transmission of the request information from the management controller 80, the wireless communication between the management unit 28 and the relevant tire air pressure sensor 34 is not established.

The rearview camera 32 and the tire air pressure sensors 34, representing examples of the second wireless communicator, are disposed at multiple distributed positions. The management controller 80 estimates the damaged position in the battery pack 26 based on the position of the second wireless communicator with which the wireless communication has been established.

For instance, when the wireless communication with the rearview camera 32 positioned at an upper level relative to the battery pack 26 is substantially established, the management controller 80 determines that the damage is present in an upper side of the battery pack 26. On the other hand, when the wireless communication with any of the tire air pressure sensors 34 positioned at a lower level relative to the battery pack 26 is substantially established, the management controller 80 determines that the damage is present in a lower side of the battery pack 26.

When the wireless communication has been substantially established in both the wireless communication with the rearview camera 32 and the wireless communication with the tire air pressure sensor 34, the management controller 80 may estimate the damaged position in the battery pack 26 based on the position at which the wireless communication has been established the larger number of times for the predetermined period. In another example, the management controller 80 may estimate the damaged position in the battery pack 26 based on the position at which the intensity of an electric wave in the wireless communication is relatively strong.

The tire air pressure sensors 34 as examples of the second wireless communicator are disposed at positions distributed around the battery pack 26 in the horizontal direction. The management controller 80 may determine that a damage to the battery pack 26 is located at one position among the positions distributed around the battery pack 26 in the horizontal direction, the position corresponding to the tire air pressure sensor 34 with which the wireless communication has been substantially established. For instance, when the wireless communication has been substantially established with the tire air pressure sensor 34a mounted to the front left wheel among the multiple tire air pressure sensors 34, the management controller 80 may determine that the damage is present at a front left position in the battery pack 26.

When the wireless communication has not been substantially established in any of the wireless communication with the rearview camera 32 and the wireless communications with all of the tire air pressure sensors 34, the management controller 80 determines that the battery pack 26 is not damaged.

Figure 4:
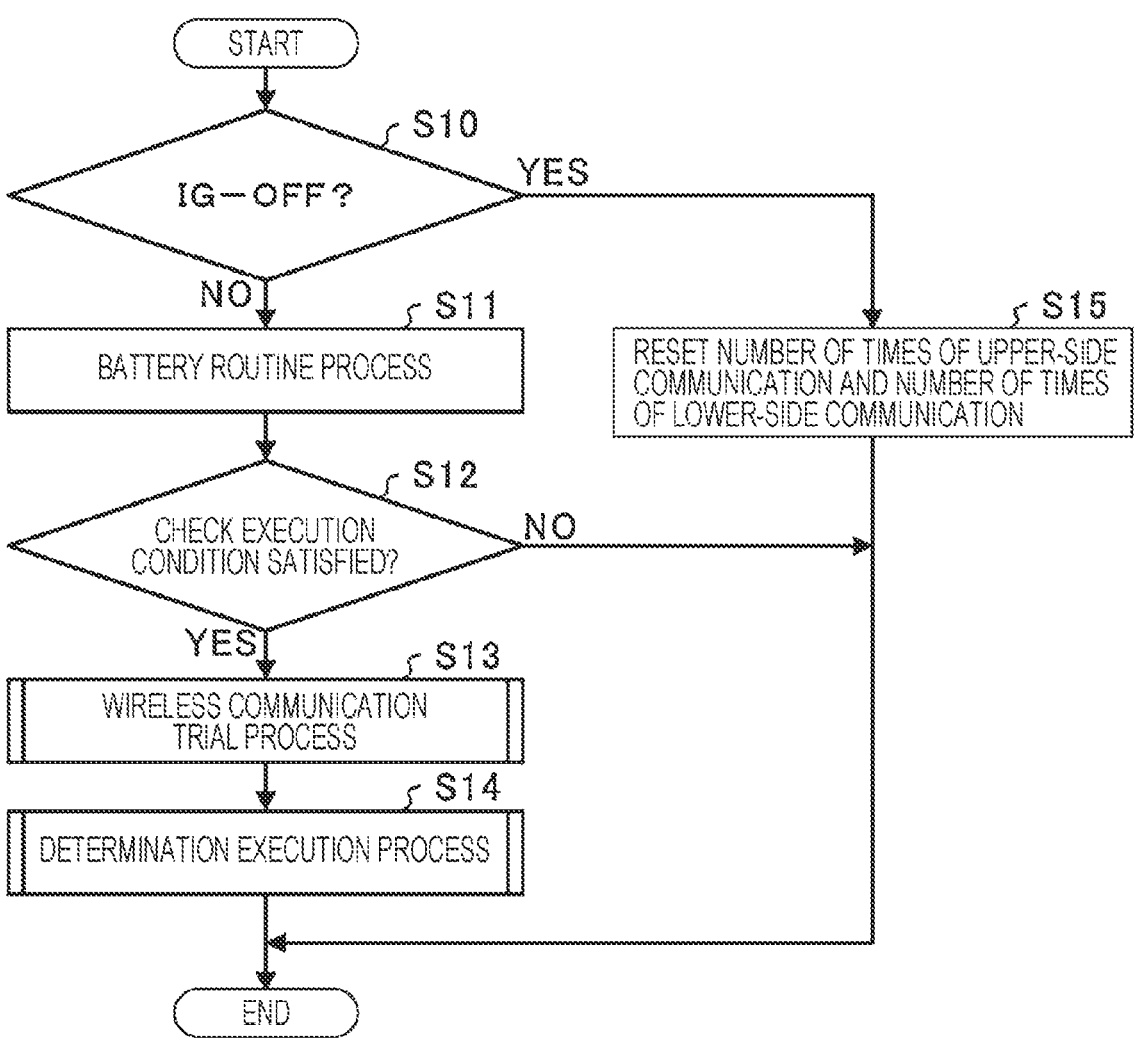
FIG. 4 is a flowchart illustrating an example of operation flow in a management controller in the management unit.

FIG. 4 is a flowchart illustrating an example of operation flow in the management controller 80 in the management unit 28. At predetermined interrupt timing that occurs at a predetermined period in an ignition-on (IG-ON) state of the vehicle 1, the management controller 80 executes a series of processing steps illustrated in FIG. 4.

When an occupant of the vehicle 1 performs an input manipulation to instruct ignition-off (IG-OFF), the vehicle controller 48 executes predetermined preprocessing to stop an operation of the vehicle 1 and then stops the operation of the vehicle 1, thus bringing the vehicle 1 into an IG-OFF state. In that preprocessing, for example, the vehicle controller 48 transmits, to the management controller 80, information indicating that IG-OFF has been instructed.

At the predetermined interrupt timing, the management controller 80 first determines whether the above-described information representing the instruction of IG-OFF has been received (S10). If the information representing the instruction of IG-OFF has not been received (NO in S10), the management controller 80 executes a battery routine process (S11). In the battery routine process, the management controller 80 obtains the current battery information including the current voltage and temperature of the battery from each monitoring unit 24. Then, the management controller 80 transmits the obtained battery information to the vehicle control device 30.

Then, the management controller 80 determines whether a check execution condition has been satisfied (S12). The check execution condition indicates a determination criterion regarding whether the damage to the battery pack 26 is to be checked. The check execution condition is, for example, whether a predetermined time has elapsed from the time of the last check. In this embodiment, if the predetermined time has elapsed from the last check, it is determined that the check execution condition has been satisfied. The predetermined time for the check execution condition may be set to a longer time (e.g., several sec) than the predetermined period (e.g., several msec) of the interrupt timing at which the series of processing steps illustrated in FIG. 4 is started.

The check execution condition is not limited to a condition regarding the time elapsed from the last check. For instance, a condition reflecting a situation that a possibility of application of an impact to the battery pack 26 increases, such as a condition that an absolute value of change in acceleration per unit time of the vehicle 1 becomes a predetermined threshold or higher, may be set as the check execution condition.

If the check execution condition has been satisfied (YES in S12), the management controller 80 executes a wireless communication trial process (S13) and then executes a determination execution process (S14). Thereafter, the management controller 80 ends the series of processing steps illustrated in FIG. 4. The wireless communication trial process is a process of trying the wireless communication between the first wireless communicator and the second wireless communicator. The determination execution process is a process of determining the presence of a damage to the battery pack 26 based on the result of the trial wireless communication in the wireless communication trial process. The wireless communication trial process and the determination execution process will be described later.

If the check execution condition is not satisfied (NO in S12), the management controller 80 ends the series of processing steps illustrated in FIG. 4.

If the information representing the instruction of IG-OFF has been received in step S10 (YES in S10), the management controller 80 ends the series of processing steps illustrated in FIG. 4 after resetting the number of times of upper-side communication and the number of times of lower-side communication to initial values (S15).

The number of times of upper-side communication indicates the number of times that upper-side wireless communication, namely the wireless communication between the first wireless communicator and the second wireless communicator positioned at the upper level relative to the battery pack 26, has been established. The number of times of lower-side communication indicates the number of times that lower-side wireless communication, namely the wireless communication between the first wireless communicator and the second wireless communicator positioned at the lower level relative to the battery pack 26, has been established. Because the tire air pressure sensors 34 are disposed in the same number as the wheels, the number of times of lower-side communication is given as a value and is set for each of the tire air pressure sensors 34.

The number of times of upper-side communication and the number of times of lower-side communication are utilized in the wireless communication trial process and the determination execution process. The number of times of upper-side communication is counted up each time the upper-side wireless communication is established in the wireless communication trial process. The number of times of lower-side communication for each of the tire air pressure sensors 34 is counted up in the wireless communication trial process each time the lower-side wireless communication with the corresponding tire air pressure sensor 34 is established.

When the number of times of upper-side communication and the number of times of lower-side communication are reset in step S15, those numbers of times start to be counted up from the initial values at the time of the next IG-ON. In other words, the number of times of upper-side communication and the number of times of lower-side communication are each given as the number of times of communication counted for a period of one driving cycle from IG-ON to IG-OFF. The count period for the number of times of upper-side communication and the number of times of lower-side communication is not limited to the one driving cycle and may be set to any suitable period such as one hour or one day, for example.

Figure 5:
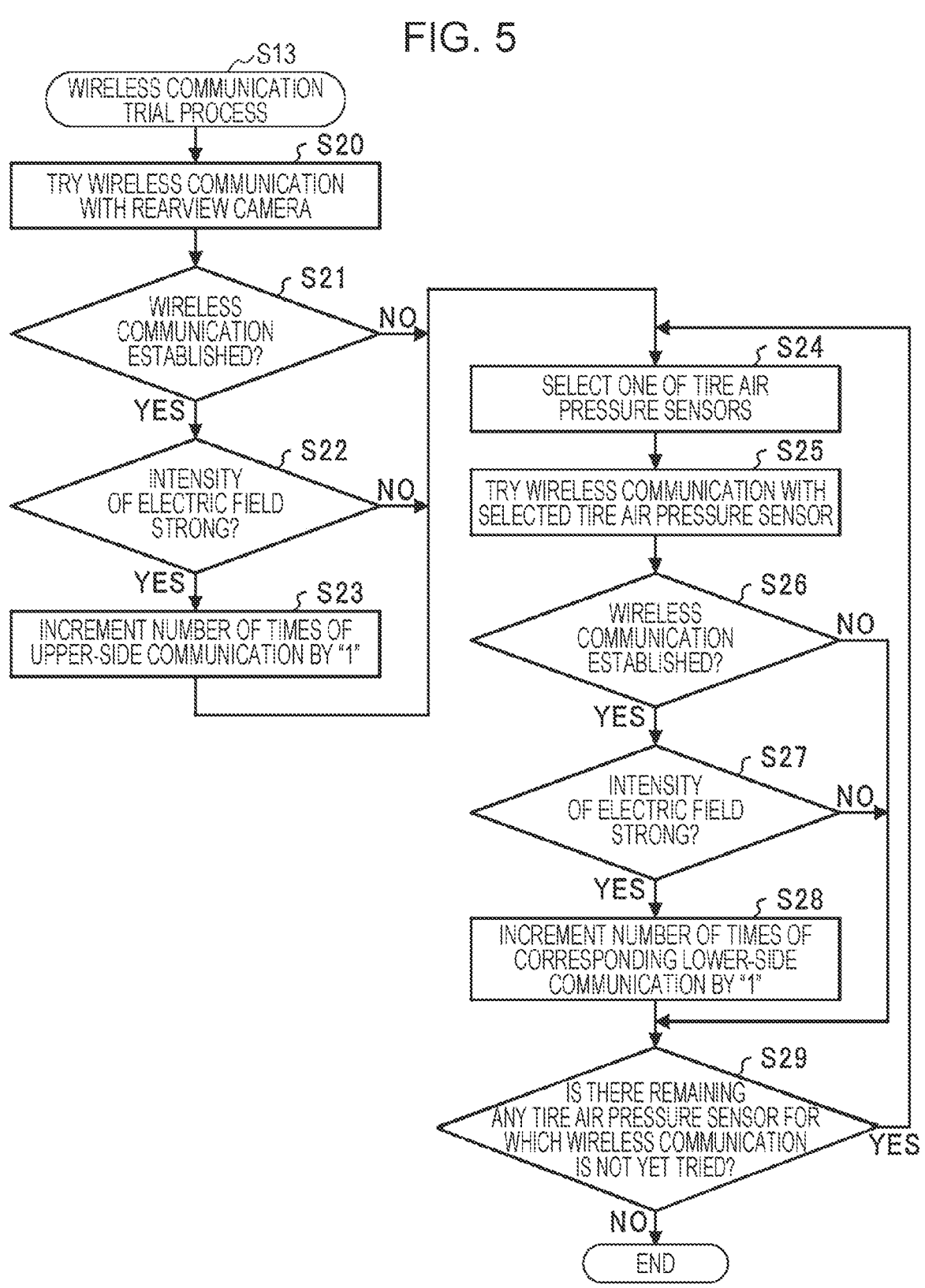
FIG. 5 is a flowchart illustrating flow of a wireless communication trial process.

FIG. 5 is a flowchart illustrating flow of the wireless communication trial process (S13). Upon start of the wireless communication trial process, the management controller 80 tries the wireless communication with the rearview camera 32 (S20). Then, the management controller 80 determines whether the wireless communication with the rearview camera 32 has been established (S21).

If the wireless communication with the rearview camera 32 has been established (YES in S21), the management controller 80 determines whether the intensity of an electric field in the wireless communication with the rearview camera 32 is strong (S22). In one example, if an absolute value of the intensity of the electric field is higher than or equal to a predetermined threshold, the management controller 80 determines that the intensity of the electric field is strong.

If the intensity of the electric field in the wireless communication with the rearview camera 32 is strong (YES in S22), the management controller 80 increments the number of times of upper-side communication by "1" (S23) and advances to processing of step S24. Thus, because the wireless communication with the rearview camera 32 has been established at the sufficient intensity of the electric field, the management controller 80 counts up the number of times of upper-side communication by "1".

If the wireless communication with the rearview camera 32 has not been established (NO in S21), the management controller 80 advances to the processing of step S24 without counting up the number of times of upper-side communication. If the wireless communication with the rearview camera 32 has been established (YES in S21), but the intensity of the electric field in the established wireless communication is weak (NO in S22), the management controller 80 also advances to the processing of step S24 without counting up the number of times of upper-side communication.

In step S24, the management controller 80 selects one of the four tire air pressure sensors 34 (S24). Then, the management controller 80 tries the wireless communication with the selected tire air pressure sensor 34 (S25). Then, the management controller 80 determines whether the wireless communication with the selected tire air pressure sensor 34 has been established (S26).

If the wireless communication with the selected tire air pressure sensor 34 has been established (YES in S26), the management controller 80 determines whether the intensity of an electric field in the wireless communication with the selected tire air pressure sensor 34 is strong (S27). In one example, if an absolute value of the intensity of the electric field is higher than or equal to a predetermined threshold, the management controller 80 determines that the intensity of the electric field is strong.

If the intensity of the electric field in the wireless communication with the selected tire air pressure sensor 34 is strong (YES in S27), the management controller 80 increments the number of times of lower-side communication corresponding to the selected tire air pressure sensor 34 by "1" (S28) and advances to processing of step S29. Thus, because the wireless communication with the selected tire air pressure sensor 34 has been established at the sufficient intensity of the electric field, the management controller 80 counts up the number of times of lower-side communication corresponding to the selected tire air pressure sensor 34 by "1".

If the wireless communication with the selected tire air pressure sensor 34 has not been established (NO in S26), the management controller 80 advances to the processing of step S29 without counting up the number of times of lower-side communication corresponding to the selected tire air pressure sensor 34. If the wireless communication with the selected tire air pressure sensor 34 has been established (YES in S26), but the intensity of the electric field in the established wireless communication is weak (NO in S27), the management controller 80 advances to the processing of step S29 without counting up the number of times of lower-side communication corresponding to the selected tire air pressure sensor 34.

In step S29, the management controller 80 determines whether there remains any of the four tire air pressure sensors 34 for which the wireless communication is not yet tried (S29). If there remains any of the four tire air pressure sensors 34 for which the wireless communication is not yet tried (YES in S29), the management controller 80 selects the remaining one tire air pressure sensor 34 or one of the remaining tire air pressure sensors 34 (S24) and repeats the processing of step S25 and the subsequent steps.

On the other hand, if there are no remaining tire air pressure sensors 34 (NO in S29), this implies that the wireless communication has been tried for all the tire air pressure sensors 34. Accordingly, the management controller 80 ends the wireless communication trial process (S13) and advances to the determination execution process (S14).

In FIG. 5, if the wireless communication with the rearview camera 32 has been established and the intensity of the electric field in the established wireless communication is strong, the number of times of upper-side communication is counted up by "1". However, the management controller 80 may omit the determination on the intensity of the electric field and may count up the number of times of upper-side communication by "1" if the wireless communication with the rearview camera 32 has been established.

Furthermore, in FIG. 5, if the wireless communication with the selected tire air pressure sensor 34 has been established and the intensity of the electric field in the established wireless communication is strong, the number of times of lower-side communication corresponding to the selected tire air pressure sensor 34 is counted up by "1". However, if the wireless communication with the selected tire air pressure sensor 34 has been established, the management controller 80 may count up the number of times of lower-side communication corresponding to the selected tire air pressure sensor 34 by "1" without executing the determination on the intensity of the electric field.

Figure 6:
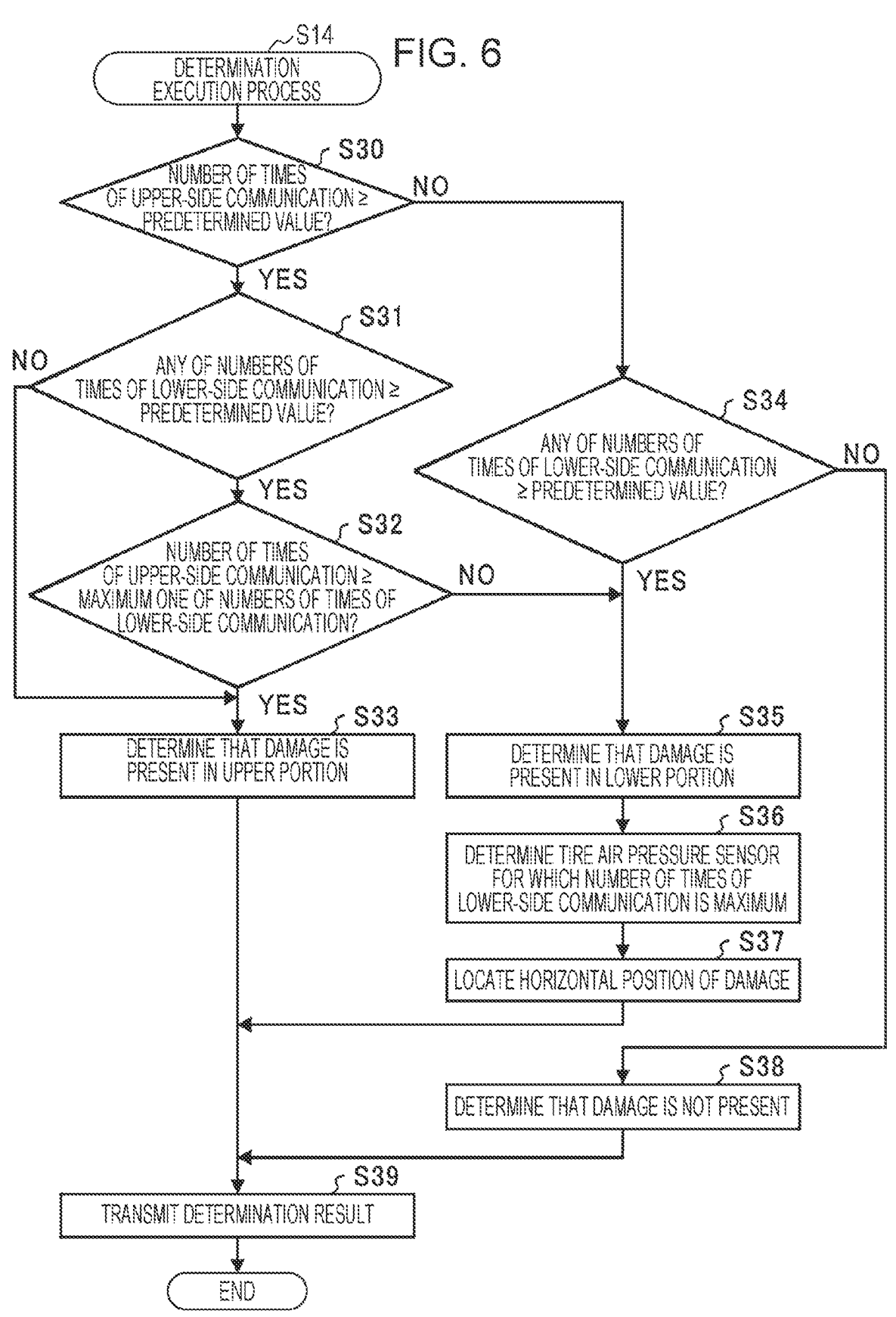
FIG. 6 is a flowchart illustrating flow of a determination execution process.

FIG. 6 is a flowchart illustrating flow of the determination execution process (S14). Upon start of the determination execution process, the management controller 80 determines whether the number of times of upper-side communication is greater than or equal to a predetermined value (S30). The predetermined value for the number of times of upper-side communication is to be set to, for example, five, namely a value with which the establishment of the upper-side wireless communication caused by the damage to the battery pack 26 and accidental establishment of the upper-side wireless communication can be discriminated from each other. The predetermined value for the number of times of upper-side communication is not limited to the above-mentioned value and may be set to any suitable value of at least one or more.

If the number of times of upper-side communication is greater than or equal to the predetermined value (YES in S30), the management controller 80 determines whether any of the numbers of times of lower-side communication is greater than or equal to a predetermined value (S31). Thus, the processing of step S31 corresponds to determination on whether one or more of the numbers of times of lower-side communication with the tire air pressure sensors 34 are greater than or equal to the predetermined value. The predetermined value for the number of times of lower-side communication may be set to the same value as or a different value from that for the number of times of upper-side communication. The predetermined value for the number of times of lower-side communication is to be set to, for example, five, namely a value with which the establishment of the lower-side wireless communication caused by the damage to the battery pack 26 and accidental establishment of the lower-side wireless communication can be discriminated from each other. The predetermined value for the number of times of lower-side communication is not limited to the above-mentioned value and may be set to any suitable value of at least one or more.

If the number of times of upper-side communication is greater than or equal to the predetermined value (YES in S30) and all the numbers of times of lower-side communication are smaller than the predetermined value (NO in S31), the management controller 80 determines that the damage is present in an upper portion of the battery pack 26 (S33) and advances to processing of step S39.

If any of the numbers of times of lower-side communication is greater than or equal to the predetermined value (YES in S31), the management controller 80 determines whether the number of times of upper-side communication is greater than or equal to a maximum one of the numbers of times of lower-side communication (S32).

If the number of times of upper-side communication is greater than or equal to the maximum number of times of lower-side communication (YES in S32), the management controller 80 determines that the damage is present in the upper portion of the battery pack 26 (S33) and advances to the processing of step S39.

On the other hand, if the number of times of upper-side communication is smaller than the maximum number of times of lower-side communication (NO in S32), the management controller 80 determines that the damage is present in a lower portion of the battery pack 26 (S35) In other words, when the upper-side wireless communication and the lower-side wireless communication are both established, the management controller 80 determines that a damage is caused at a position corresponding to either one of the upper-side wireless communication and the lower-side wireless communication, the one providing a greater number of times that the wireless communication has been established.

If the number of times of upper-side communication is smaller than the predetermined value in step S30 (NO in S30), the management controller 80 determines whether any of the numbers of times of lower-side communication is greater than or equal to the predetermined value (S34). Details of processing in step S34 is the same as those in step S31.

If the number of times of upper-side communication is smaller than the predetermined value (NO in S30) and any of the numbers of times of lower-side communication is greater than or equal to the predetermined value (YES in S34), the management controller 80 determines that the damage is present in the lower portion of the battery pack 26 (S35).

As described above, the management controller 80 can estimate the presence of a damage to the battery pack 26 based on the number of times that the wireless communication is established between the inside and the outside of the battery pack 26. Furthermore, since the second wireless communicators outside the battery pack 26 are disposed at distributed positions at the upper level and the lower level relative to the battery pack 26, the management controller 80 can further estimate the damaged position of the battery pack 26 (e.g., in which one of the upper and the lower portions thereof).

After determining that the damage is present in the lower portion of the battery pack 26, the management controller 80 determines which one of the four tire air pressure sensors 34 provides a maximum one of the numbers of times of lower-side communication corresponding to the four tire air pressure sensors 34 (S36). Then, the management controller 80 locates a horizontal position of the damage to the battery pack 26 based on the position of the determined tire air pressure sensor 34 (S37) and advances to the processing of S39.

The entirety of the battery pack 26 can be divided into, for example, four areas at a front left side, a front right side, a rear left side, and a rear left side. It is here supposed that the management controller 80 has determined the tire air pressure sensor 34a mounted to the front-left wheel as the target one among the four tire air pressure sensors 34. The determined front-left tire air pressure sensor 34a is closest to the front left area of the battery pack 26 among the four areas of the battery pack 26 in the horizontal direction. In this case, therefore, the management controller 80 can determine that the damage is present at the front left position in the battery pack 26.

Because of the second wireless communicators at the lower level relative to the battery pack 26 being disposed at the positions distributed around the battery pack 26 in the horizontal direction, if the management controller 80 has determined that the damage is present in the lower side of the battery pack 26, it can further estimate the horizontal position of the damage. As a result, the management controller 80 can more exactly estimate the damaged position in the battery pack 26.

If the number of times of upper-side communication is smaller than the predetermined value (NO in S30) and all the numbers of times of lower-side communication are smaller than the predetermined value (NO in S34), the management controller 80 determines that the battery pack 26 is not damaged (S38) and advances to the processing of S39.

In step S39, the management controller 80 transmits the determination result regarding the damage to the battery pack 26 to the vehicle control device 30 and ends the determination execution process.

When the received determination result indicates at least that the damage is present in the battery pack 26 regardless of the damaged position in the battery pack 26, the vehicle control device 30 may issue a predetermined notification indicating the presence of the damage to the battery pack 26. On that occasion, the vehicle controller 48 may notify, in addition to the presence of the damage to the battery pack 26, the damaged position indicated by the received determination result. The notification can be given by any suitable method of, for example, displaying an alarm on the instrument panel or the like.

As described above, in the battery pack monitoring device 10 according to the first embodiment, whether the battery pack 26 is damaged is estimated based on the establishment state of the wireless communication between the first wireless communicator inside the battery pack 26 and the one or more second wireless communicators outside the battery pack 26. Therefore, the battery pack monitoring device 10 according to the first embodiment can monitor the battery pack 26 and can detect the damage to the battery pack 26.

In the battery pack monitoring device 10 according to the first embodiment, the second wireless communicators are disposed at multiple positions. Furthermore, in the battery pack monitoring device 10 according to the first embodiment, the damaged position in the battery pack 26 is estimated based on the position of any of the second wireless communicators for which the wireless communication has been established with the first wireless communicator. Therefore, the battery pack monitoring device 10 according to the first embodiment can detect, in addition to the presence of the damage to the battery pack 26, the damaged position in the battery pack 26 as well.

In the battery pack monitoring device 10 according to the first embodiment, the multiple second wireless communicators are positioned at the upper level and the lower level relative to the battery pack 26. Therefore, when the wireless communication with the second wireless communicator positioned at the upper level relative to the battery pack 26 is established, the battery pack monitoring device 10 according to the first embodiment can estimate that the damage is present in the upper portion of the battery pack 26. When the wireless communication with the second wireless communicator positioned at the lower level relative to the battery pack 26 is established, the battery pack monitoring device 10 according to the first embodiment can estimate that the damage is present in the lower portion of the battery pack 26.

In the battery pack monitoring device 10 according to the first embodiment, the second wireless communicators are disposed at the positions distributed around the battery pack 26 in the horizontal direction. Therefore, the battery pack monitoring device 10 according to the first embodiment can estimate the horizontal position of the damage to the battery pack 26 based on the position of the second wireless communicator for which the wireless communication has been established.

In the battery pack monitoring device 10 according to the first embodiment, the rearview camera 32 and the tire air pressure sensors 34 function as the second wireless communicators outside the battery pack 26. However, the second wireless communicators are not limited to the rearview camera 32 and the tire air pressure sensors 34. Any suitable device disposed outside the battery pack 26 in the vehicle 1 and having the wireless communication function may be utilized as the second wireless communicator.

In the battery pack monitoring device 10 according to the first embodiment, the management unit 28, the rearview camera 32, and the tire air pressure sensor 34 all installed in the vehicle 1 in advance are utilized as the first wireless communicator and the second wireless communicators. Comparing with the case of newly installing the first wireless communicator and the second wireless communicators, therefore, an installation space for the first wireless communicator and the second wireless communicators is not increased additionally, and the battery pack monitoring device 10 can be easily applied to the vehicle 1. Alternatively, a device functioning as either one of the first wireless communicator and the second wireless communicator may be newly installed in the vehicle 1.

In the battery pack monitoring device 10 according to the first embodiment, the multiple second wireless communicators are disposed outside the battery pack 26. However, the number of second wireless communicators to be disposed may be at least one or more. The embodiment of the disclosure is not limited to the example in which the rearview camera 32 and the tire air pressure sensor 34 are both disposed as the second wireless communicators, either one of the rearview camera 32 and the tire air pressure sensor 34 may be disposed. Moreover, the embodiment of the disclosure is not limited to the example in which multiple tire air pressure sensors 34 are disposed as the second wireless communicators, and any one of the tire air pressure sensors 34 may be merely disposed.

In the first embodiment, the wireless communication is tried between the management unit 28 in the battery pack 26 and each of the rearview camera 32 and the tire air pressure sensors 34. However, the monitoring unit 24 with the wireless communication function is also disposed inside the battery pack 26. Taking into consideration the above point, in a second embodiment, wireless communication is tried between the monitoring unit 24 and each of the rearview camera 32 and the tire air pressure sensors 34, and a damage to the battery pack 26 is estimated based on the establishment state of the trial wireless communication.

Figure 7:
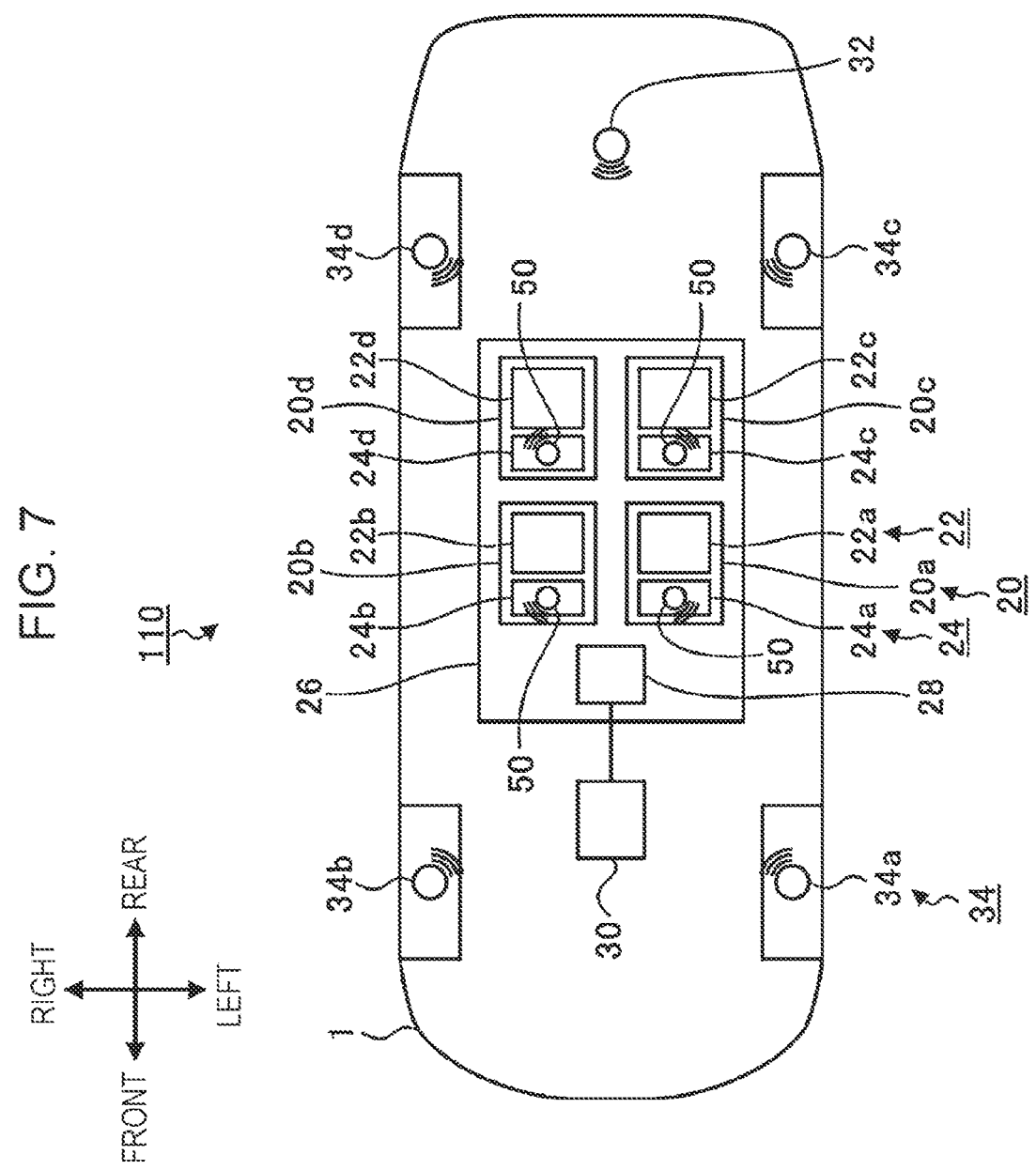
FIG. 7 is a schematic plan view illustrating a configuration of a vehicle to which a battery pack monitoring device according to an second embodiment is applied.

FIG. 7 is a schematic plan view illustrating a configuration of a vehicle 1 to which a battery pack monitoring device 110 according to the second embodiment is applied. In FIG. 7, ripple marks as an example of pictographic symbols indicate that the wireless communication is tried between the monitoring communicator 50 in the monitoring unit 24 and the rearview camera 32, and that the wireless communication is tried between the monitoring communicator 50 in the monitoring unit 24 and each tire air pressure sensor 34.

The first wireless communicator in the battery pack monitoring device 110 according to the second embodiment is, for example, the monitoring unit 24 disposed inside the battery pack 26, more exactly the monitoring communicator 50 in the monitoring unit 24. In the battery pack monitoring device 110, as illustrated in FIG. 7, multiple first wireless communicators are disposed inside the battery pack 26 at positions distributed in the horizontal direction with respect to the battery pack 26.

A monitoring unit 24a is disposed at a front left side within the inner space of the battery pack 26 relative to the other monitoring units 24. Among distances between the monitoring unit 24a and the individual tire air pressure sensors 34, the distance between the monitoring unit 24a and the tire air pressure sensor 34a mounted to the front left wheel is shortest. Thus, the monitoring unit 24a disposed at the front left side corresponds to the tire air pressure sensor 34a mounted to the front left wheel.

A monitoring unit 24b is disposed at a front right side within the inner space of the battery pack 26 relative to the other monitoring units 24. Among distances between the monitoring unit 24b and the individual tire air pressure sensors 34, the distance between the monitoring unit 24b and the tire air pressure sensor 34b mounted to the front right wheel is shortest. Thus, the monitoring unit 24b disposed at the front right side corresponds to the tire air pressure sensor 34b mounted to the front right wheel.

A monitoring unit 24c is disposed at a rear left side within the inner space of the battery pack 26 relative to the other monitoring units 24. Among distances between the monitoring unit 24c and the individual tire air pressure sensors 34, the distance between the monitoring unit 24c and the tire air pressure sensor 34c mounted to the rear left wheel is shortest. Thus, the monitoring unit 24c disposed at the rear left side corresponds to the tire air pressure sensor 34c mounted to the rear left wheel.

A monitoring unit 24d is disposed at a rear right side within the inner space of the battery pack 26 relative to the other monitoring units 24. Among distances between the monitoring unit 24d and the individual tire air pressure sensors 34, the distance between the monitoring unit 24d and the tire air pressure sensor 34d mounted to the rear right wheel is shortest. Thus, the monitoring unit 24d disposed at the rear right side corresponds to the tire air pressure sensor 34d mounted to the rear right wheel.

In the battery pack monitoring device 110 according to the second embodiment, wireless communication between the monitoring unit 24 and each of the rearview camera 32 and the tire air pressure sensors 34 is tried with the management controller 80 in the management unit 28 instructing each of the monitoring units 24 to try the wireless communication. In the second embodiment, details of the wireless communication trial process (S13) and the determination execution process (S14) are different from those in the first embodiment.

In the battery pack monitoring device 110 according to the second embodiment, the damaged position in the battery pack 26 is estimated based on the position of the first wireless communicator for which the wireless communication with the second wireless communicator has been established. For instance, when the monitoring unit 24a among the multiple monitoring units 24, disposed at the front left side, has established the wireless communication with the tire air pressure sensor 34a mounted to the front left wheel, it is estimated that a damage is present at the front left position in the battery pack 26.

Furthermore, as described above, the monitoring unit 24a corresponds to the tire air pressure sensor 34a. Therefore, the wireless communication between the monitoring unit 24a and the tire air pressure sensor 34a is established with a higher possibility than that between the monitoring unit 24a and each of the other tire air pressure sensors 34 except for the tire air pressure sensor 34a.

In consideration of the above point, the monitoring unit 24a may try the wireless communication with at least the tire air pressure sensor 34a corresponding to the monitoring unit 24a and may omit the trial wireless communication with the other tire air pressure sensors 34. If the number of times of lower-side communication between the monitoring unit 24a and at least the tire air pressure sensor 34a has become the predetermined value or greater, the management controller 80 may estimate that a damage is present in the battery pack 26 at a horizontal position corresponding to the position of the monitoring unit 24a.

The above description has been made in relation to the monitoring unit 24a. However, as with the monitoring unit 24a, each of the other monitoring units 24b, 24c and 24d may also try the wireless communication with the tire air pressure sensor 34 corresponding to the monitoring unit 24 of interest and may omit the trial wireless communication with the other tire air pressure sensors 34. If the number of times of lower-side communication between each of the other monitoring units 24 and at least the tire air pressure sensor 34 corresponding to the monitoring unit 24 of interest has become the predetermined value or greater, the management controller 80 may estimate that a damage is present in the battery pack 26 at a horizontal position corresponding to the position of the monitoring unit 24 of interest.

Figure 8:
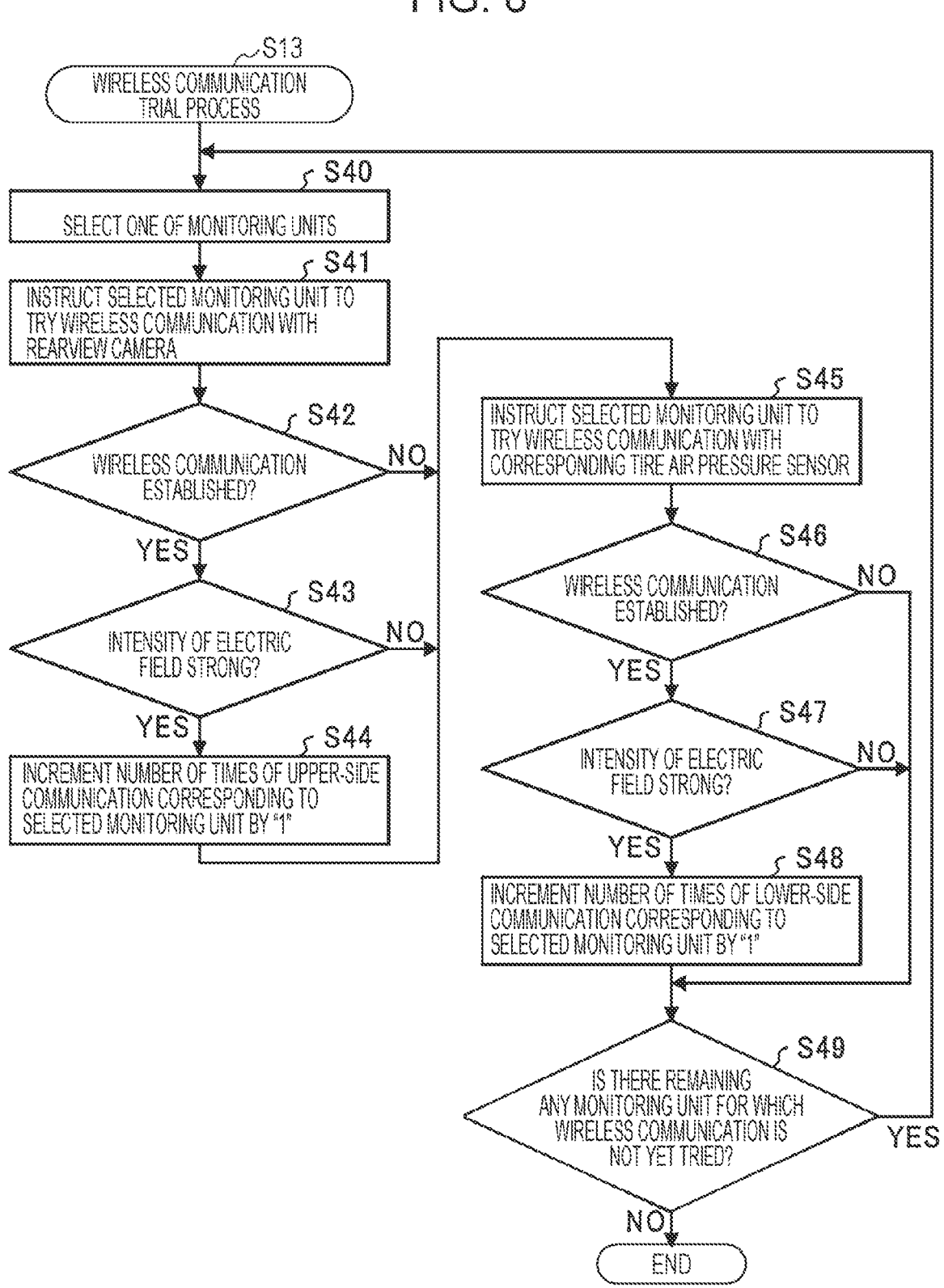
FIG. 8 is a flowchart illustrating flow of a wireless communication trial process in the embodiment.

FIG. 8 is a flowchart illustrating flow of the wireless communication trial process (S13) in the second embodiment. Upon start of the wireless communication trial process, the management controller 80 selects one monitoring unit 24 that is going to try wireless communication (S40). Then, the management controller 80 performs wireless communication with the selected monitoring unit 24 and instructs the selected monitoring unit 24 to try wireless communication between the selected monitoring unit 24 and the rearview camera 32 (S41). Thus, the selected monitoring unit 24 tries the wireless communication with the rearview camera 32 in response to the instruction from the management controller 80.

Then, the management controller 80 determines whether the wireless communication between the selected monitoring unit 24 and the rearview camera 32 has been established (S42).

If the wireless communication between the selected monitoring unit 24 and the rearview camera 32 has been established (YES in S42), the management controller 80 determines whether the intensity of an electric field in the wireless communication between the selected monitoring unit 24 and the rearview camera 32 is strong (S43). In one example, if an absolute value of the intensity of the electric field is higher than or equal to a predetermined threshold, the management controller 80 determines that the intensity of the electric field is strong.

If the intensity of the electric field is strong (YES in S43), the management controller 80 increments the number of times of upper-side communication corresponding to the selected monitoring unit 24 by "1" (S44) and advances to processing of step S45. In the second embodiment, because each of the monitoring units 24 tries the wireless communication with the rearview camera 32, numbers of times of upper-side communication are each provided and set in a one-to-one relation to the monitoring units 24. In step S44, among the numbers of times of upper-side communication, the number of times corresponding to the selected monitoring unit 24 is counted up by "1".

If the wireless communication between the selected monitoring unit 24 and the rearview camera 32 has not been established (NO in S42), the management controller 80 advances to the processing of step S45 without counting up the number of times of upper-side communication. If the wireless communication between the selected monitoring unit 24 and the rearview camera 32 has been established (YES in S42), but the intensity of the electric field in the established wireless communication is weak (NO in S43), the management controller 80 also advances to the processing of step S45 without counting up the number of times of upper-side communication.

In step S45, the management controller 80 performs wireless communication with the selected monitoring unit 24 and instructs the selected monitoring unit 24 to try wireless communication with the tire air pressure sensor 34 corresponding to the selected monitoring unit 24 (S45). Thus, the selected monitoring unit 24 tries the wireless communication with the tire air pressure sensor 34 corresponding to the selected monitoring unit 24 in response to the instruction from the management controller 80.

Then, the management controller 80 determines whether the wireless communication between the selected monitoring unit 24 and the tire air pressure sensor 34 corresponding to the selected monitoring unit 24 has been established (S46).

If the wireless communication between the selected monitoring unit 24 and the tire air pressure sensor 34 corresponding to the selected monitoring unit 24 has been established (YES in S46), the management controller 80 determines whether the intensity of an electric field in the wireless communication between the selected monitoring unit 24 and the tire air pressure sensor 34 corresponding to the selected monitoring unit 24 is strong (S47). In one example, if an absolute value of the intensity of the electric field is higher than or equal to a predetermined threshold, the management controller 80 determines that the intensity of the electric field is strong.

If the intensity of the electric field is strong (YES in S47), the management controller 80 increments the number of times of lower-side communication for the tire air pressure sensor 34 corresponding to the selected monitoring unit 24 by "1" (S48) and advances to processing of step S49. In the second embodiment, because each of the monitoring units 24 tries the wireless communication with the tire air pressure sensor 34 corresponding to the monitoring unit 24 of interest, numbers of times of lower-side communication are each provided and set in a one-to-one relation to the monitoring units 24. In step S48, among the numbers of times of lower-side communication, the number of times corresponding to the selected monitoring unit 24 is counted up by "1".

If the wireless communication between the selected monitoring unit 24 and the tire air pressure sensor 34 corresponding to the selected monitoring unit 24 has not been established (NO in S46), the management controller 80 advances to the processing of step S49 without counting up the number of times of lower-side communication. If the wireless communication between the selected monitoring unit 24 and the tire air pressure sensor 34 corresponding to the selected monitoring unit 24 has been established (YES in S46), but the intensity of the electric field in the established wireless communication is weak (NO in S47), the management controller 80 also advances to the processing of step S49 without counting up the number of times of lower-side communication.

In step S49, the management controller 80 determines whether there remains any of all the monitoring units 24 for which the wireless communication is not yet tried (S49). If there remains any of the monitoring units 24 for which the wireless communication is not yet tried (YES in S49), the management controller 80 selects the remaining one monitoring unit 24 or one of the remaining monitoring units 24 (S40) and repeats the processing of step S41 and the subsequent steps.

If the wireless communication has been tried for all the monitoring units 24 (NO in S49), the management controller 80 ends the wireless communication trial process (S13) and advances to the determination execution process (S14).

The management controller 80 may omit the determination on the intensity of the electric field in step S43 and may count up the number of times of upper-side communication corresponding to the selected monitoring unit 24 by "1" if the wireless communication between the selected monitoring unit 24 and the rearview camera 32 has been established. The management controller 80 may omit the determination on the intensity of the electric field in step S47 and may count up the number of times of lower-side communication corresponding to the selected monitoring unit 24 by "1" if the wireless communication between the selected monitoring unit 24 and the tire air pressure sensor 34 corresponding to the selected monitoring unit 24 has been established.

Figure 9:
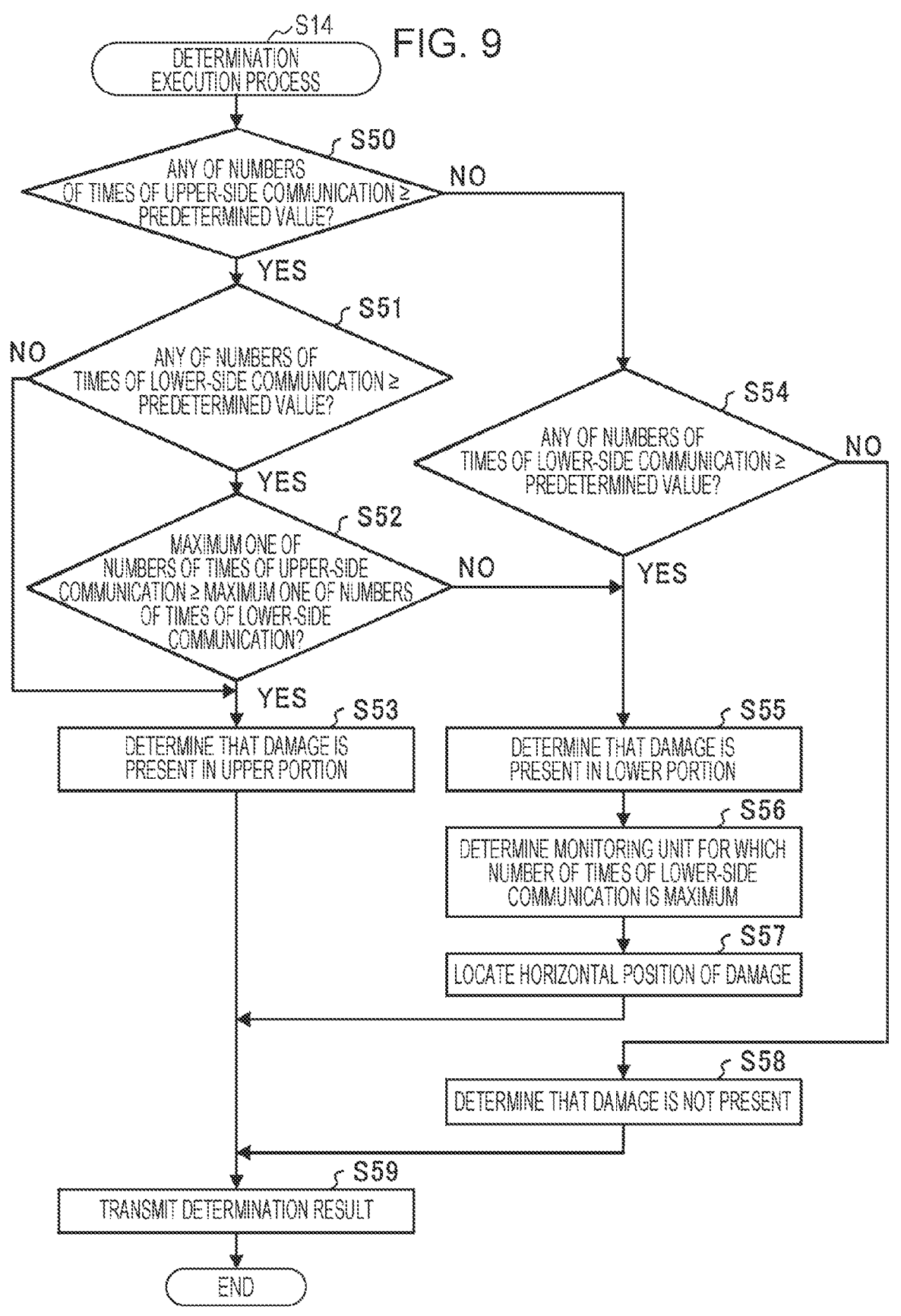
FIG. 9 is a flowchart illustrating flow of a determination execution process in the embodiment.

FIG. 9 is a flowchart illustrating flow of the determination execution process (S14) in the second embodiment. Upon start of the determination execution process, the management controller 80 determines whether any of the numbers of times of upper-side communication is greater than or equal to a predetermined value (S50). The predetermined value used here is set to, for example, the same value as that in step S30 of FIG. 6 in the first embodiment. However, the predetermined value is not limited to such an example and may be set to any suitable value of one or more.

If any of the numbers of times of upper-side communication is greater than or equal to the predetermined value (YES in S50), the management controller 80 determines whether any of the numbers of times of lower-side communication is greater than or equal to a predetermined value (S51). The predetermined value used here is set to, for example, the same value as that in step S31 of FIG. 6 in the first embodiment. However, the predetermined value is not limited to such an example and may be set to any suitable value of one or more.

If any of the numbers of times of upper-side communication is greater than or equal to the predetermined value (YES in S50), but all the numbers of times of lower-side communication are smaller than the predetermined value (NO in S51), the management controller 80 determines that the damage is present in an upper portion of the battery pack 26 (S53) and advances to processing of step S59.

If any of the numbers of times of upper-side communication is greater than or equal to the predetermined value (YES in S50) and any of the numbers of times of lower-side communication is greater than or equal to the predetermined value (YES in S51), the management controller 80 determines whether a maximum one of the numbers of times of upper-side communication is greater than or equal to a maximum one of the numbers of times of lower-side communication (S52).

If the maximum one of the numbers of times of upper-side communication is greater than or equal to the maximum one of the numbers of times of lower-side communication (YES in S52), the management controller 80 determines that the damage is present in the upper portion of the battery pack 26 (S53) and advances to the processing of step S59.

If the maximum one of the numbers of times of upper-side communication is smaller than the maximum one of the numbers of times of lower-side communication (NO in S52), the management controller 80 determines that the damage is present in a lower portion of the battery pack 26 (S55).

If all the numbers of times of upper-side communication are smaller than the predetermined value (NO in S50), the management controller 80 determines whether any of the numbers of times of lower-side communication is greater than or equal to the predetermined value (S54). Processing of this step S54 is the same as that of step S51.

If all the numbers of times of upper-side communication are smaller than the predetermined value (NO in S50) and any of the numbers of times of lower-side communication is greater than or equal to the predetermined value (YES in S54), the management controller 80 determines that the damage is present in the lower portion of the battery pack 26 (S55).

After determining that the damage is present in the lower portion of the battery pack 26, the management controller 80 determines which one of the monitoring units 24 provides the maximum one of the numbers of times of lower-side communication (S56). Then, the management controller 80 locates the horizontal position of the damage to the battery pack 26 based on the position of the determined monitoring unit 24 (S57) and advances to the processing of step S59. It is here supposed, for example, that the management controller 80 has determined the monitoring unit 24*a* as the target one among the four monitoring units 24, the unit 24*a* being disposed at the front left side in the battery pack 26. In this case, the management controller 80 determines that the damage is present at the front left position in the battery pack 26.

If all the numbers of times of upper-side communication are smaller than the predetermined value (NO in S50) and all the numbers of times of lower-side communication are smaller than the predetermined value (NO in S54), the management controller 80 determines that the battery pack 26 is not damaged (S58) and advances to the processing of S59.

In step S59, the management controller 80 transmits the determination result regarding the damage to the battery pack 26 to the vehicle control device 30 (S59) and ends the determination execution process.

As described above, the battery pack monitoring device 110 according to the second embodiment can monitor the battery pack 26 and can detect the damage to the battery pack 26 as with the battery pack monitoring device according to the first embodiment.

In the battery pack monitoring device 110 according to the second embodiment, the first wireless communicators are disposed inside the battery pack 26 at the positions distributed in the horizontal direction with respect to the battery pack 26. Furthermore, in the battery pack monitoring device 110 according to the second embodiment, the damaged position in the battery pack 26 is estimated based on the position of any of the first wireless communicators for which the wireless communication has been established with the second wireless communicator. Therefore, the battery pack monitoring device 110 according to the second embodiment can detect, in addition to the presence of the damage to the battery pack 26, the damaged position in the battery pack 26 as well.

Figure 10:
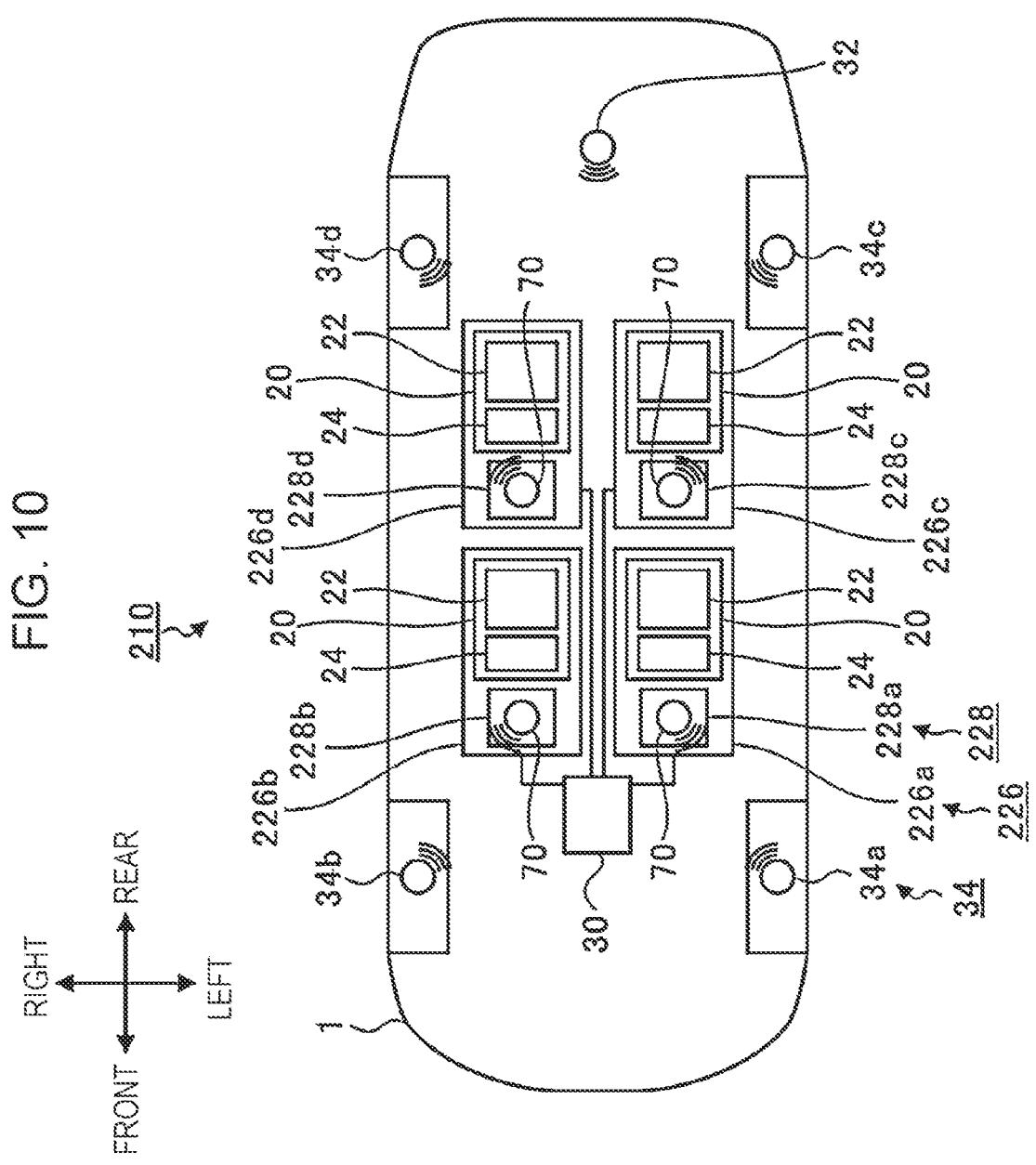
FIG. 10 is a schematic plan view illustrating a configuration of a vehicle to which a battery pack monitoring device according to an embodiment is applied.

FIG. 10 is a schematic plan view illustrating a configuration of a vehicle 1 to which a battery pack monitoring device 210 according to a third embodiment is applied. In the first embodiment and the second embodiment, as described above, one battery pack 26 is installed in the vehicle 1. By contrast, in the third embodiment, a battery pack 226a, a battery pack 226b, a battery pack 226c, and a battery pack 226d are installed in the vehicle 1.

Hereinafter, the battery pack 226a, the battery pack 226b, the battery pack 226c, and the battery pack 226d are collectively referred to as a "battery pack 226" in some cases. However, the embodiment of the disclosure is not limited to the example in which the four battery packs 226 are installed in the vehicle 1, and two, three, or five or more battery packs 226 may be installed in the vehicle 1.

The battery pack 226a is disposed at a front left side of the vehicle 1 relative to the other battery packs 226. Among distances between the battery pack 226a and the individual tire air pressure sensors 34, the distance between the battery pack 226a and the tire air pressure sensor 34a mounted to the front left wheel is shortest. Thus, the battery pack 226a disposed at the front left side corresponds to the tire air pressure sensor 34a mounted to the front left wheel.

The battery pack 226b is disposed at a front right side of the vehicle 1 relative to the other battery packs 226. Among distances between the battery pack 226b and the individual tire air pressure sensors 34, the distance between the battery pack 226b and the tire air pressure sensor 34b mounted to the front right wheel is shortest. Thus, the battery pack 226b disposed at the front right side corresponds to the tire air pressure sensor 34b mounted to the front right wheel.

The battery pack 226c is disposed at a rear left side of the vehicle 1 relative to the other battery packs 226. Among distances between the battery pack 226c and the individual tire air pressure sensors 34, the distance between the battery pack 226c and the tire air pressure sensor 34c mounted to the rear left wheel is shortest. Thus, the battery pack 226c disposed at the rear left side corresponds to the tire air pressure sensor 34c mounted to the rear left wheel.

The battery pack 226d is disposed at a rear right side of the vehicle 1 relative to the other battery packs 226. Among distances between the battery pack 226d and the individual tire air pressure sensors 34, the distance between the battery pack 226d and the tire air pressure sensor 34d mounted to the rear right wheel is shortest. Thus, the battery pack 226d disposed at the rear right side corresponds to the tire air pressure sensor 34d mounted to the rear right wheel.

A management unit 228a is disposed in the battery pack 226a. A management unit 228b is disposed in the battery pack 226b. A management unit 228c is disposed in the battery pack 226c. A management unit 228d is disposed in the battery pack 226d. Hereinafter, the management unit 228a, the management unit 228b, the management unit 228c, and the management unit 228d are collectively referred to as a "management unit 228" in some cases.

Each of the management units 228 in the individual battery packs 226 includes, as in the first embodiment, a management communicator 70 capable of performing the wireless communication. A processor 72 in each management unit 228 functions as a management controller 80 as in the first embodiment. Accordingly, each of the management controllers 80 in the individual management units 228 can try wireless communication with the rearview camera 32 and the tire air pressure sensors 34 as in the first embodiment. In FIG. 10, ripple marks as an example of pictographic symbols indicate that the wireless communication is tried between each of the management units 228 and each of the rearview camera 32 and the tire air pressure sensors 34.

As in the first embodiment, each of the management controllers 80 in the individual management units 228 can estimate the presence of the damage and the damaged position in the battery pack 226 based on the establishment state of the wireless communication between that the management unit 228 and each of the rearview camera 32 and the tire air pressure sensors 34. In other words, in spite of the multiple battery packs 226 being disposed in the vehicle 1, the presence of the damage and the damaged position in the battery packs 226 can be estimated for each of the battery packs 226.

Furthermore, as described above, the battery pack 226a corresponds to the tire air pressure sensor 34a. Therefore, the wireless communication between the management unit 228a in the battery pack 226a and the tire air pressure sensor 34a is established with a higher possibility than that between the management unit 228a and the other tire air pressure sensors 34 except for the tire air pressure sensor 34a.

In consideration of the above point, the management controllers 80 in the management unit 228a may try the wireless communication with at least the tire air pressure sensor 34a corresponding to the battery pack 226a and may omit the trial wireless communication with the other tire air pressure sensors 34. If the number of times of lower-side communication with at least the tire air pressure sensor 34a has become the predetermined value or greater, the management controller 80 in the management unit 228a may estimate that a damage is present in the battery pack 226a to which the management unit 228a belongs.

The above description has been made in relation to the estimation of the damage to the battery pack 226a. For each of the other battery packs 226b, 226c and 226d, however, it is also possible to, as with the battery pack 226a, try the wireless communication with the tire air pressure sensor 34 corresponding to each of the other battery packs 226 and to omit the trial wireless communications with the other tire air pressure sensors 34. The management controller 80 in each of the management units 228 may estimate that a damage is present in the battery pack 226 to which the management unit 228 of interest belongs, if at least the number of times of lower-side communication with the tire air pressure sensor 34 corresponding to the management unit 228 of interest has become the predetermined value or greater.

As described above, the battery pack monitoring device 210 according to the third embodiment can monitor the battery pack 226 and can detect the damage to the battery pack 226 as in the first embodiment. Moreover, the battery pack monitoring device 210 according to the third embodiment can detect, in addition to the presence of the damage to the battery pack 226, the damaged position in the battery pack 226 as well.

While the embodiments of the disclosure have been described above with reference to the accompanying drawings, it is to be understood that the disclosure is not limited to the above-described embodiments. It is apparent that those skilled in the art can conceive various variations and/or modifications within the concept not departing from the scope defined in Claims, and that those variations and/or modifications also fall within the technical scope of the disclosure.

For instance, in the above-described embodiments, the management unit 28 or 228 in the battery pack 26 or 226 functions as a control device for executing the wireless communication trial process and the determination execution process. However, the embodiment of the disclosure is not limited to the example in which the management unit 28 or 228 executes the wireless communication trial process and the determination execution process. Any other suitable computer installed in the vehicle 1 may execute the wireless communication trial process and the determination execution process. In an example, the vehicle control device 30 may execute the wireless communication trial process and the determination execution process.

In the above-described embodiments, the state in which the wireless communication is not established between the first wireless communicator and the second wireless communicator is normal. The rearview camera 32 as an example of the second wireless communicator establishes wireless communication with the vehicle control device 30 according to its inherent function. If a malfunction occurs in the rearview camera 32, the vehicle control device 30 can recognize the malfunction of the rearview camera 32 due to the fact that the wireless communication with the rearview camera 32 has not been established.

Accordingly, the vehicle control device 30 may periodically transmit a recognition result about the occurrence of a malfunction of the second wireless communicator, such as the rearview camera 32, to the management controller 80 via wired communication. This enables the management controller 80 to discriminate whether the state in which the wireless communication between the first wireless communicator and the second wireless communicator is not established is caused by the absence of a damage to the battery pack 26 or the occurrence of a malfunction of the second wireless communicator.

The vehicle control device 30 (the processor 42), the monitoring unit 24 (the processor 52), and the battery pack 26 (the processor 72) illustrated in FIG. 3 can be implemented by circuitry including at least one semiconductor integrated circuit such as at least one processor (e.g., a central processing unit (CPU)), at least one application specific integrated circuit (ASIC), and/or at least one field programmable gate array (FPGA). At least one processor can be configured, by reading instructions from at least one machine readable tangible medium, to perform all or a part of functions of the processor 42 including the vehicle controller 48, the processor 52 including the monitoring controller 60, and the processor 72 including the management controller 80. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the non-volatile memory may include a ROM and a NVRAM. The ASIC is an integrated circuit (IC) customized to perform, and the FPGA is an integrated circuit designed to be configured after manufacturing in order to perform, all or a part of the functions of the modules illustrated in FIG. 3.

The invention claimed is:

1. A battery pack monitoring device comprising:
one or more memories; and
one or more processors coupled to the one or more memories and configured to:
try a wireless communication between a first wireless communicator and two or more second wireless communicators,
the first wireless communicator being disposed inside a battery pack and configured to perform wireless communication with the second wireless communicator,
the battery pack being installed in a vehicle, formed as a hollow box made of a metal material and enclosed by the metal material, and
the second wireless communicators being disposed respectively at distributed positions in the vehicle outside the battery pack and configured to perform wireless communication with the first wireless communicator;
detect a damaged portion of the battery pack through which electric waves are allowed to propagate between inside of the battery pack with outside of the battery pack, by detecting a state in which wireless communication is established between the first wireless communicator and the second wireless communicator;
when detecting that a wireless communication with the first wireless communicator and one or more of the second wireless communicators is established, count a number of times that intensity of an electric field in the wireless communication is equal to or more than a threshold; and
calculate a position of the damaged portion using a position of a second wireless communicator of the one or more of the second wireless communicators that provides a maximum value of the number of times.

2. The battery pack monitoring device according to claim 1, wherein
the second wireless communicators are disposed respectively at distributed positions, and
the one or more processors are configured to estimate a position of the damaged portion to the battery pack based on a position of any of the second wireless communicators for which the wireless communication with the first wireless communicator is established.

3. The battery pack monitoring device according to claim 2, wherein
the second wireless communicators are disposed respectively at distributed positions above and below the battery pack, and the one or more processors are configured to:

determine that the damaged portion is present in an upper portion of the battery pack, in a case where the wireless communication between the first wireless communicator and any of the second wireless communicators positioned above the battery pack is established, and determine that the damaged portion is present in a lower portion of the battery pack, in a case where the wireless communication between the first wireless communicator and any of the second wireless communicators positioned below the battery pack is established.

4. The battery pack monitoring device according to claim 2, wherein the second wireless communicators are disposed respectively at positions distributed around the battery pack in a horizontal direction, and the one or more processors are configured to determine that the damaged portion is present at a position corresponding to any of the second wireless communicators for which the wireless communication with the first wireless communicator is established among horizontal positions in the battery pack.

5. The battery pack monitoring device according to claim 3, wherein the second wireless communicators are disposed respectively at positions distributed around the battery pack in a horizontal direction, and the one or more processors are configured to determine that the damaged portion is present at a position corresponding to any of the second wireless communicators for which the wireless communication with the first wireless communicator is established among horizontal positions in the battery pack.

6. The battery pack monitoring device according to claim 1, wherein the first wireless communicator is one of a plurality of first wireless communicators, and the first wireless communicators are disposed inside the battery pack respectively at positions distributed in a horizontal direction with respect to the battery pack.

7. The battery pack monitoring device according to claim 2, wherein the first wireless communicator is one of a plurality of first wireless communicators, and the first wireless communicators are disposed inside the battery pack respectively at positions distributed in a horizontal direction with respect to the battery pack.

8. The battery pack monitoring device according to claim 3, wherein the first wireless communicator is one of a plurality of first wireless communicators, and the first wireless communicators are disposed inside the battery pack respectively at positions distributed in a horizontal direction with respect to the battery pack.

9. The battery pack monitoring device according to claim 4, wherein the first wireless communicator is one of a plurality of first wireless communicators, and the first wireless communicators are disposed inside the battery pack respectively at positions distributed in the horizontal direction with respect to the battery pack.

10. The battery pack monitoring device according to claim 5, wherein the first wireless communicator is one of a plurality of first wireless communicators, the first wireless communicators are disposed inside the battery pack respectively at positions distributed in the horizontal direction with respect to the battery pack.

\* \* \* \* \*